United States Patent [19]

Ishibashi

[11] Patent Number: 5,374,904
[45] Date of Patent: Dec. 20, 1994

[54] PHASE-LOCKED-LOOP CIRCUIT HAVING ADJUSTABLE REFERENCE CLOCK SIGNAL FREQUENCY AND FILTER CAPACITANCE COMPENSATION

[75] Inventor: Atsuhiko Ishibashi, Itami, Japan

[73] Assignee: Mitsubishi Denki Kabushiki Kaisha, Tokyo, Japan

[21] Appl. No.: 79,755

[22] Filed: Jun. 22, 1993

[30] Foreign Application Priority Data

Oct. 9, 1992 [JP] Japan .................................. 4-271486

[51] Int. Cl.⁵ ....................... H03L 7/085; H03L 7/093
[52] U.S. Cl. .......................................... 331/17; 331/8; 331/25
[58] Field of Search ................ 331/8, 17, 18, 25, 175

[56] References Cited

U.S. PATENT DOCUMENTS 4,536,720  8/1985  Cranford, Jr. et al. ............... 331/57
5,053,723  10/1991  Schemmel ............................ 331/17

FOREIGN PATENT DOCUMENTS 2-48824  2/1990  Japan .

OTHER PUBLICATIONS

IEEE Journal of Solid–State Circuits, vol. sc–22, No. 2, Apr. 1987, Deog-Kyoon Jeong, et al., "Design of PLL–Based Clock Generation Circuits", pp. 255–261.

*Primary Examiner*—David Mis
*Attorney, Agent, or Firm*—Oblon, Spivak, McClelland, Maier & Neustadt

[57] ABSTRACT

A phase synchronization circuit including a phase-locked-loop synchronizes a phase of a clock signal with a phase of a reference clock signal having a frequency desired by a user. The gates of an NMOS transistor and a PMOS transistors are connected in common to a resistor. The drain and the source of the NMOS transistor are both connected to a ground potential while the drain and the source of the PMOS transistor are both connected to a power source voltage. By changing a number of NMOS and PMOS transistors formed during a metallization process, the capacitance in a loop filter is easily changed.

7 Claims, 8 Drawing Sheets

PHASE-LOCKED-LOOP CIRCUIT HAVING ADJUSTABLE REFERENCE CLOCK SIGNAL FREQUENCY AND FILTER CAPACITANCE COMPENSATION

BACKGROUND OF THE INVENTION

1. Field of the Invention

The present invention relates to an electric circuit which incorporates a semiconductor transistor and in which a clock signal is used. The present invention is directed in particular to a phase-locked-loop circuit for synchronizing the phase of a signal which is derived by a voltage controlled oscillator to the phase of a reference signal.

2. Description of the Prior Art

Recent developments in semiconductor technology have made it possible for a plurality of equipments mounted in a semiconductor integrated circuit device (hereinafter "LSI") to operate at an increasingly faster speed. Hence, a technical challenge now encountered in enhancing the operation speeds is increasing the speed with which a clock signal which specifies the operation speeds of the equipments incorporated in an LSI is externally supplied to an LSI and distributed to the equipments incorporated in the LSI.

One approach to the problem is to use a phase-locked-loop circuit (hereinafter "PLL circuit") to eliminate a signal delay which is created during distribution of the clock signal to the respective equipments. The PLL circuit is mounted in the LSI and synchronizes the phase of a clock signal which has been supplied to the equipments included in the LSI to the phase of a clock signal which is supplied from outside the LSI.

An analog PLL circuit used for such an objective is shown in FIG. 9. The circuit of FIG. 9 is disclosed in *IEEE JOURNAL OF SOLID-STATE CIRCUITS*, Vol. 22, No. 2, April 1987, pgs. 255 to 261.

The phase of an inner clock signal 12 to be distributed within the LSI needs to be synchronized to a reference phase of a reference clock signal 11, and therefore, is compared with the phase of the reference clock signal 11 in a phase frequency comparator 1. A charge pump circuit 2 outputs a predetermined electric charge in accordance with a phase difference between the two clock signals. The electric charge is accumulated and consequently smoothed in a loop filter 3 which comprises resistors 301 and 302 and a capacitor 303. A potential $V_{VCO}$ which corresponds to the phase difference between the inner clock signal 12 and the reference clock signal 11 is applied to a voltage controlled oscillator (hereinafter "VCO") 4. Based on the potential $V_{VCO}$, the VCO 4 generates a basic clock signal which has a frequency corresponding to the phase difference between the inner clock signal 12 and the reference clock signal 11. Receiving the basic clock signal, a clock signal generator 5 generates various clocks including the inner clock signal 12. That is, the inner clock signal 12 is fed back and synchronized to the reference clock signal 11 to thereby stabilize the phase of the inner clock signal 12.

In such a conventional PLL circuit, first, the frequency of the reference clock signal 11 is determined according to a user's instruction, and then the loop filter 3, the VCO 4 and the other elements are designed to accommodate to the decided frequency. Following this, based on the design, mask patterns are formed which will be used in manufacturing the PLL circuit. Thus, the conventional PLL circuit is tailored especially for the user according to the user's instruction.

On the other hand, there is a demand for incorporating the PLL circuit in a semicustom semiconductor integrated circuit such as a gate array so that equipments formed by the gate array are provided with a signal which is synchronized to an external clock signal which is supplied from the PLL circuit. However, since different users use different external clock signal frequencies, if the PLL circuit is to be incorporated in the gate array, special design for the loop filter 3 and the like is necessary to attain the clock signal frequency which is demanded by the user. This directly contradicts the desired flexibility of the gate array, that is, the major blessing of the gate array.

In addition, a large area is needed to form the capacitor 303 in the loop filter 3, which makes it impossible to enhance the device density.

SUMMARY OF THE INVENTION

A phase-locked-loop circuit comprises: clock signal generating means having an input terminal and at least one output terminal, the clock signal generating means generating a clock signal based on a potential received at the input terminal and giving the clock signal to the output terminal; charge generating means for receiving the clock signal which is supplied to the output terminal of the clock signal generating means and a reference clock signal and for generating an electric charge which corresponds to a difference in phase between the clock signal which is given to the output terminal and a reference clock signal; and potential generating means having an input terminal for receiving the electric charge and an output terminal for generating a potential which is dependent on the electric charge. The potential generating means comprises: a first potential terminal for receiving a relatively high potential; a second potential terminal for receiving a relatively low potential; one or more first insulated gate capacitors each having an n type semiconductor layer, an insulating layer and a gate electrode, the n type semiconductor layer being connected to the first potential terminal, the insulating layer being formed on the n type semiconductor layer, and the gate electrode being disposed in a faced relation with the insulating layer; one or more second insulated gate capacitors each having an p type semiconductor layer, an insulating layer and a gate electrode, the p type semiconductor layer being connected to the second potential point, the insulating layer being formed on the p type semiconductor layer and the gate electrode being disposed in a faced relation with the insulating layer; and a resistor having one end which is connected to the input and the output terminals of the potential generating means and the other end which is connected to the gate electrodes of the first and the second insulated gate capacitors.

The clock signal generating means may further have a first processing means and a second processing means, the first processing means generating a basic signal which has a frequency which is dependent on a potential which is supplied to the input terminal of the clock signal generating means, the second processing means generating the clock signal based on the basic signal.

In a preferred aspect, the potential generating means has: a phase frequency comparator for outputting first phase information and second phase information, the first phase information concerning whether the clock signal which is supplied to the output terminal of the clock signal generating means has a phase lag or phase lead with respect to the reference clock signal, the second phase information having a pulse width which corresponds to a phase difference between the clock signal which is supplied to the output terminal of the clock signal generating means and the reference clock signal; and a charge pump circuit for receiving the first and second phase information and for generating the electric charge.

In other preferred aspect, the phase-locked-loop circuit may include a plurality of the first insulated gate capacitors.

In other preferred aspect, the phase-locked-loop circuit may include a plurality of the second insulated gate capacitors.

The one or more first insulated gate capacitors may each include a p type insulated gate field effect transistor which has two current electrodes which are connected to the first potential terminal.

The one or more second insulated gate capacitors may each include an n type insulated gate field effect transistor which has two current electrodes which are connected to the second potential terminal.

The capacitance to be present in the potential generating means is created by the two insulated gate capacitors of complementary conductivities. Since the insulating layers of insulated gate capacitors are thin, a large area is not necessary to ensure a desired capacitance.

Even when potentials at the gate electrodes of the two insulated gate capacitors which are connected in common decrease, since the two insulated gate capacitors compensate for each other's capacitance loss, the capacitance created by the two insulated gate capacitors would not largely decease.

The insulated gate capacitors are formed by MIS transistors. Hence, they are easily formed on a gate array, enabling the capacitance value to be changed only by a change in a metallization process.

Thus, the reference clock signal desired by a user is attained at the voltage controlled means and the loop filter means. Renewed designs for the voltage controlled means and the loop filter means are therefore unnecessary, promising ease in manufacturing. The voltage controlled means and the loop filter means are formed by elements which obtain changed characteristics when wiring patterns are changed. Hence, it is possible to change the frequency of the reference clock signal.

Accordingly, it is an object of the present invention to obtain an PLL circuit which requires neither sacrifice in the flexibility of a gate array nor a large area.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 9:
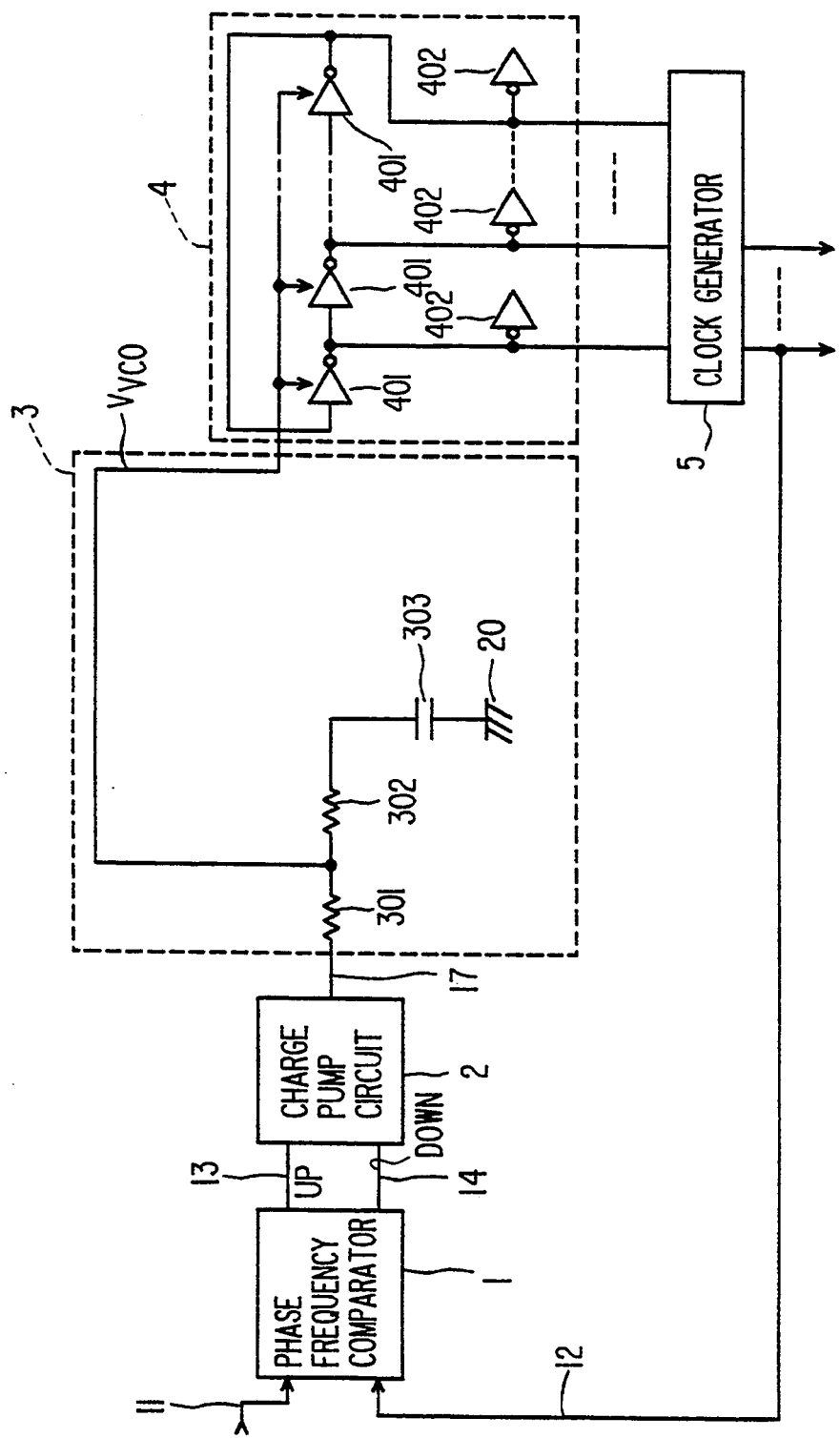
FIG. 9 is a circuit diagram for explaining a conventional technique.

Before describing a preferred embodiment of the present invention, explanation will be given of the technique which constitutes the basis of the present invention, that is, formation of the capacitor 303 in the conventional technique shown in FIG. 9 with a MOS transistor. The description of the basic technique will be followed by description of a preferred embodiment of the present invention.

A. Technique Constituting the Basis of the Invention

Figure 5:
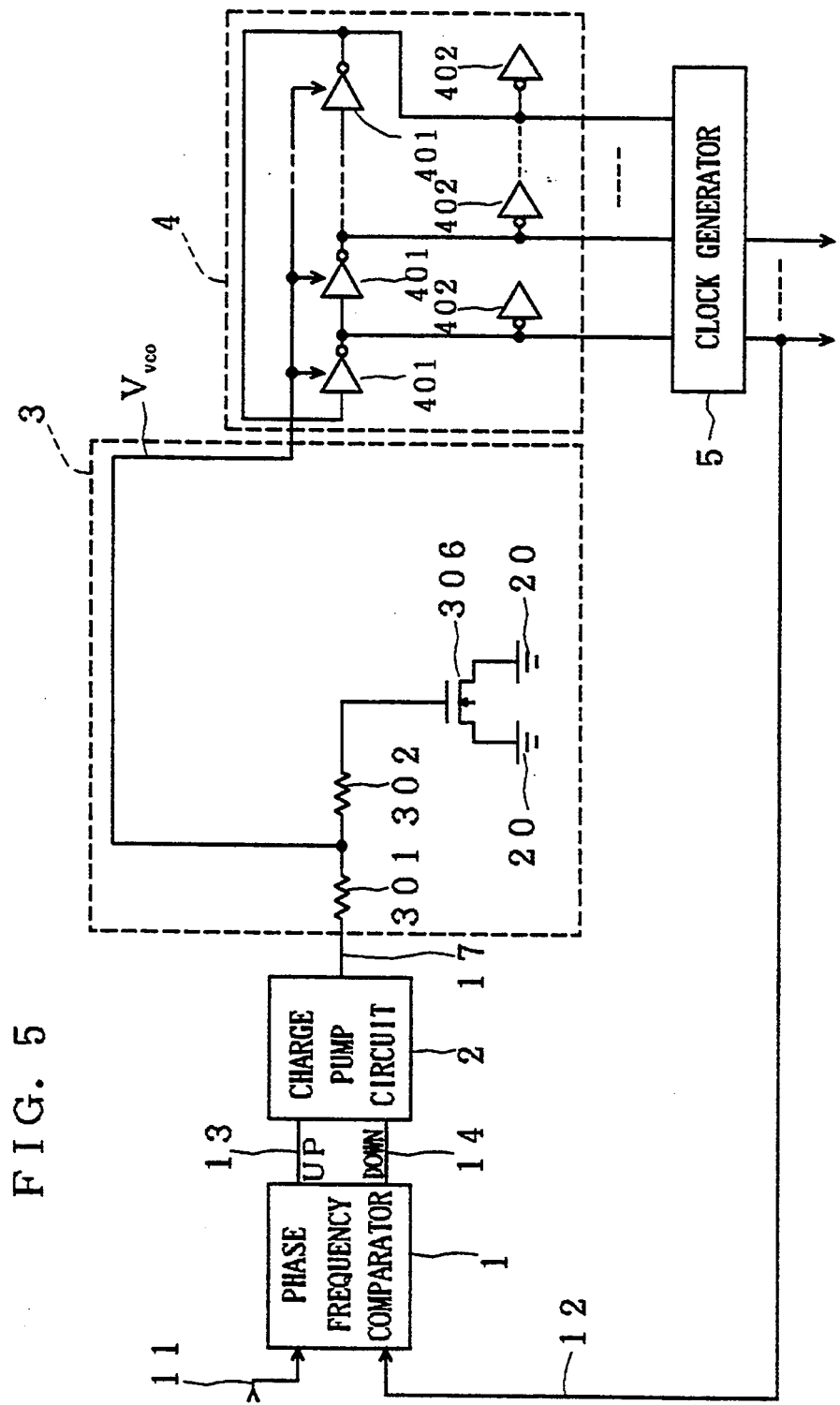
FIG. 5 is a circuit diagram for explaining a technique constituting the basis of the present invention.

FIG. 5 is a circuit diagram of a PLL circuit, showing the technique constituting the basis of the present invention. The circuit structure of FIG. 5 is similar to the circuit structure of FIG. 9 but is different in that the capacitor 303 is replaced with an NMOS transistor 306. The gate of the NMOS transistor 306 corresponds to one end of the capacitor 303 and the source and the drain of the NMOS transistor 306 correspond to the other end of the capacitor 303. In other words, the gate of the NMOS transistor 306 is connected to the resistor 302 and the source and the drain of the NMOS transistor 306 are connected to a ground potential ($V_{ss}$) 20. Hence, the NMOS transistor 306 serves as a MOS capacitor which has a capacitance value of $C_1$.

Figure 6:
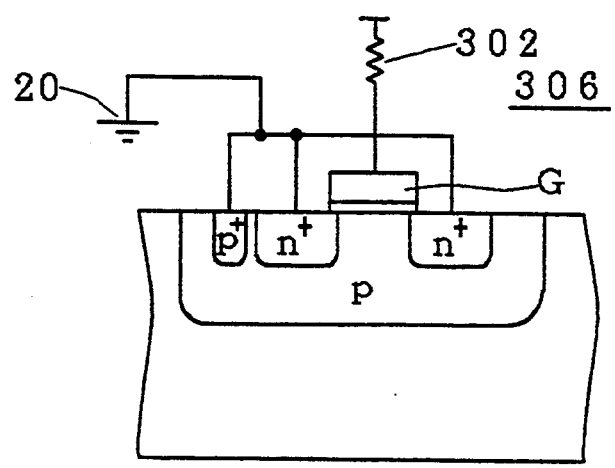
FIG. 6 is a cross sectional view of a MOS transistor which is used to attain a technique constituting the basis of the present invention.

FIG. 6 is a cross sectional view of the NMOS transistor 306. An electric charge is accumulated between a p well layer and a gate electrode G so that a MOS capacitor is created between the resistor 302 and the $V_{SS}$ 20.

The resistors 301 and 302 are also provided in the loop filter 3. The resistances of the resistors 301 and 302 are $R_1$ and $R_2$, respectively. The resistors 301 and 302 are series connected between the electric charge pump circuit 2 and the MOS capacitor created by the NMOS transistor 306.

Figure 7:
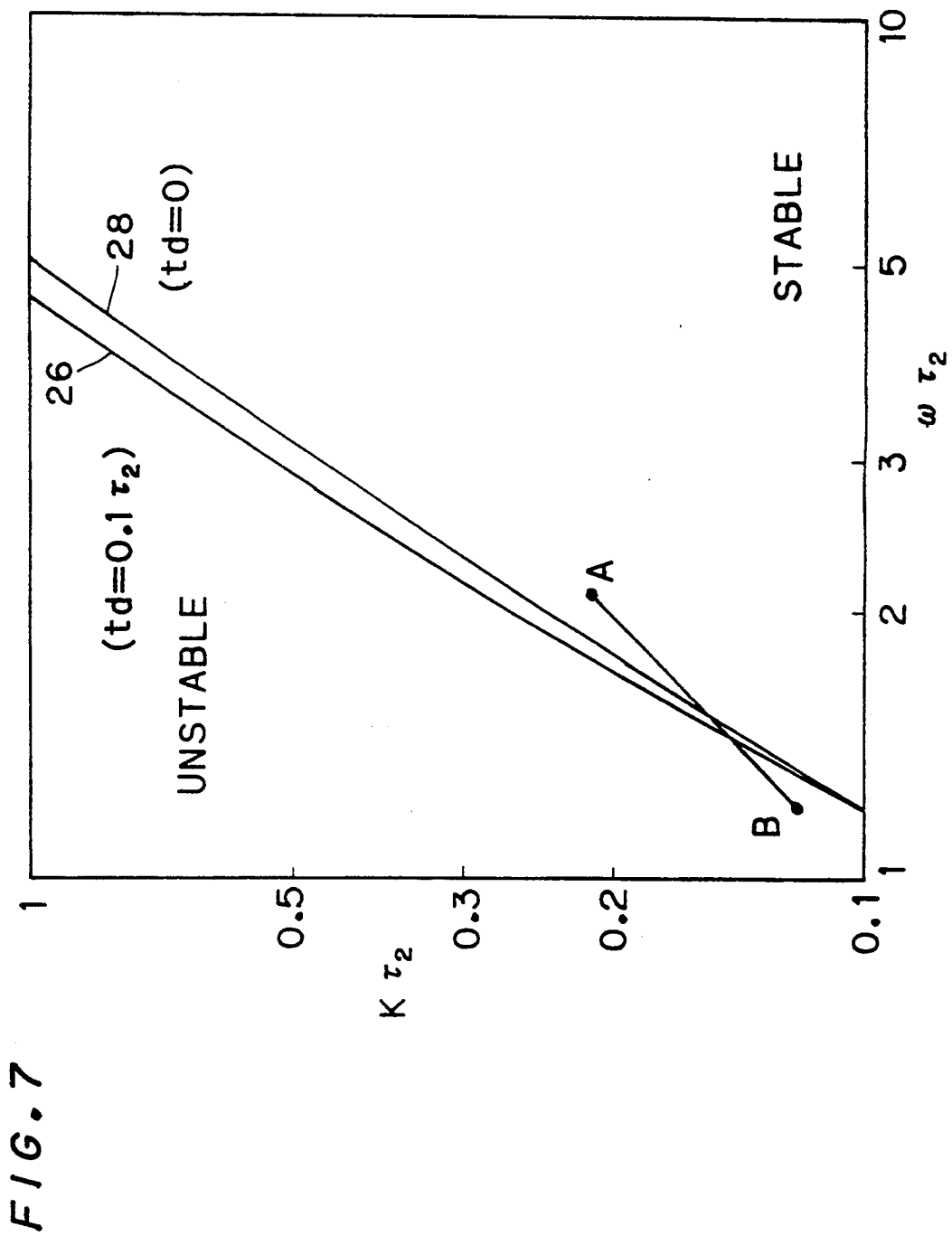
FIGS. 7 and 8 are graphs for explaining the technique constituting the basis of the present invention.

The constants of the respective elements determine whether the PLL circuit comprising the loop filter 3 stably enters the synchronizing mode. More precisely, the keys here are the values of the resistors 301 and 302 of the loop filter 3 and the MOS capacitor created by the NMOS transistor 306 ($R_1$, $R_2$ and $C_1$) and a change in the frequency at the VCO 4 in response to a variation in the potential $V_{VCO}$ ($\Delta f/\Delta V_{VCO}$; hereinafter "VCO gain"). According to the literature introduced earlier, the conditions for stable operations of the PLL circuit are given as:

$$K\tau_2 < \cfrac{1}{\cfrac{\pi}{\omega \tau_2}\left(\cfrac{\pi}{\omega \tau_2} + 1 - \cfrac{td}{\tau_2}\right)} \tag{1}$$

where
$K = K_0\, I_P\, R_2$
$K_0 =$ VCO gain ($\Delta f/\Delta V_{VCO}$)
$I_P =$ Maximum current through the resistors 301 and 302 (which decreases with an increase in $R_1$, $R_2$)
$\tau_2 = R_2 \times C_1$
$\omega = 2\pi f$ f = Frequency of the reference clock signal 11
td = Delay time created by the PLL circuit FIG. 7 is a graph showing the stability in phase synchronization of the PLL circuit. To stably synchronize the phase of the inner clock signal 12 to that of the reference clock signal 11, the PLL circuit must operate in such a manner that the coordinates ($\omega\tau_2 2$, $K\tau_2 2$) stay in a stable region on the right side of a stability limit curve 26 (or 28). The stability limit curves 26 and 28 are plotted on the premise that delay times td created by the PLL circuit as a whole are 0.1 $\tau_2$ and 0, respectively.

As understood from Eq. 1 and FIG. 7, when the frequency f of the reference clock signal 11 is largely changed, the values of the resistors 301 and 302 of the loop filter 3 and the MOS capacitor created by the NMOS transistor 306 ($R_1$, $R_2$ and $C_1$) are changed so that the PLL circuit is designed to satisfy Eq. 1.

The capacitance value $C_1$ of the MOS capacitor is controlled by changing the number of NMOS transistors 306. Hence, even if the PLL circuit needs to be formed in a gate array, various frequencies f of the reference clock signal 11 can be dealt with by changing the metallization process. Further, since an insulating layer of the MOS capacitor is thinner than an insulating layer of a capacitor of an ordinary structure by about a factor of ten, a large capacitance is ensured in a predetermined area. Hence, the existence of the capacitor would not prevent an improvement in the device density.

It is to be noted, however, that the basic technique hereinabove described alone does not promise stable phase synchronization in actual operations of the PLL circuit. This is because the capacitance value $C_1$ of the MOS capacitor is dependent on an applied gate voltage supplied to the gate electrode.

Figure 8:
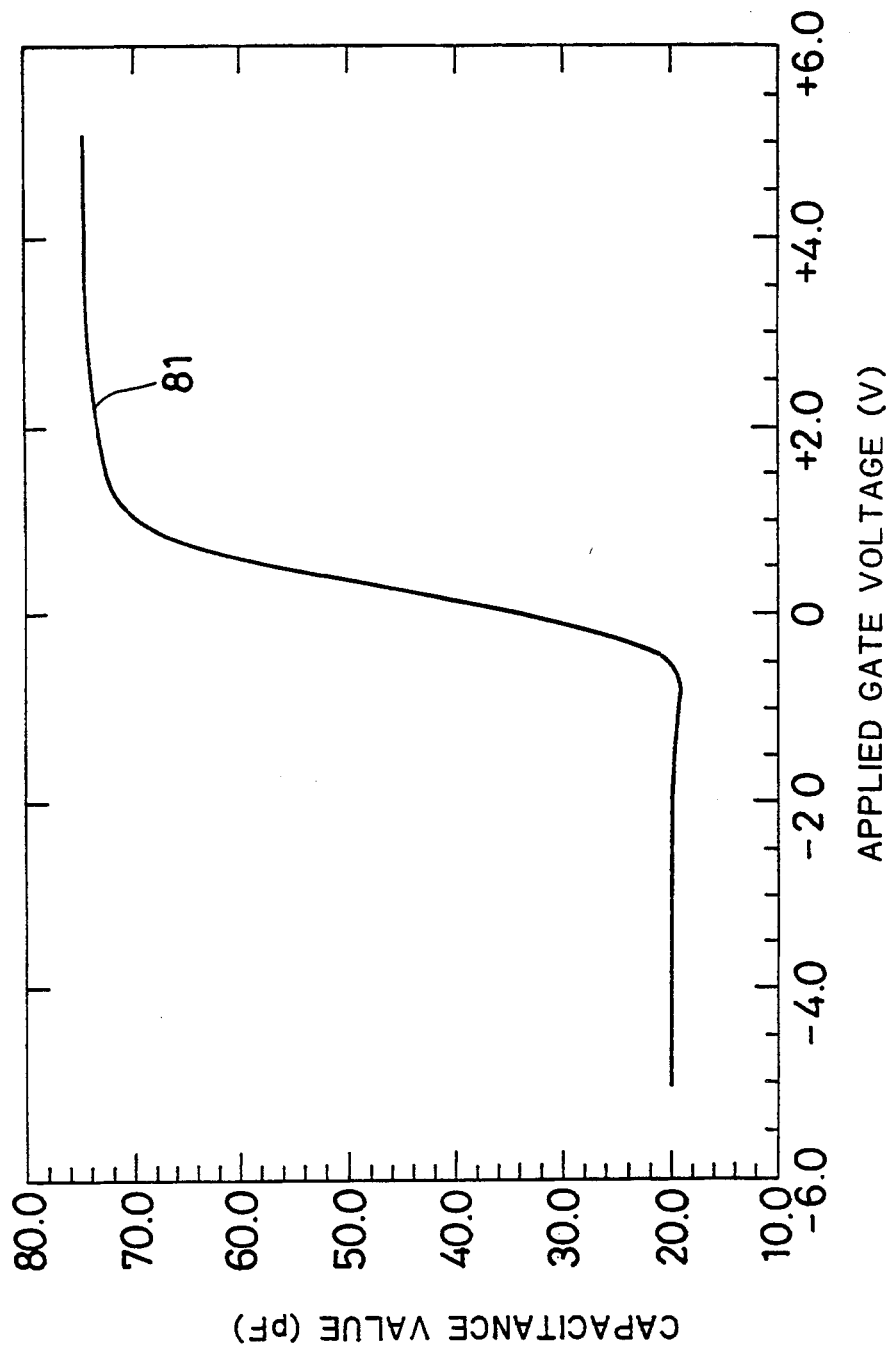

FIG. 8 is a graph showing a dependence of the capacitance value of the MOS capacitor on the applied gate voltage. The capacitance value of the MOS capacitor which is created by the NMOS transistor 306 largely decreases with a decrease in the applied gate voltage (to equal to or below 1 V in the example of FIG. 8) as indicated by the curve 81.

As shown in FIG. 5, the gate electrode of the NMOS transistor 306 is connected to the resistor 302. Hence, depending on the polarity and the pulse width of an electric charge output from the charge pump circuit 2, the capacitance created by the NMOS transistor 306 decreases, whereby the coordinates ($\omega\tau_2 2$, $K\tau_2 2$) move to an unstable region on the left to the stability limit curve 26 (or 28).

FIG. 7 also shows how the coordinates ($\omega\tau_2 2$, $K\tau_2 2$) move as the applied gate voltage and hence the capacitance value $C_1$ decrease under certain conditions. The point A corresponds to a situation where the applied gate voltage is 2 V (the capacitance value is about 74 pF). As the applied gate voltage drops, the coordinates ($\omega\tau_2 2$, $K\tau_2 2$) shift toward the point B. With a drop of the applied gate voltage down to 0.1 V (the capacitance value is about 42 pF), the coordinates ($\omega\tau_2 2$, $K\tau_2 2$) reach the point B, entering the unstable region.

This proves that the basic technique alone is not sufficient in some cases to ensure stable phase synchronization in the PLL circuit by using a potential which is supplied to the gate electrode of the NMOS transistor 306.

B. Preferred Embodiment of the Invention

Figure 1:
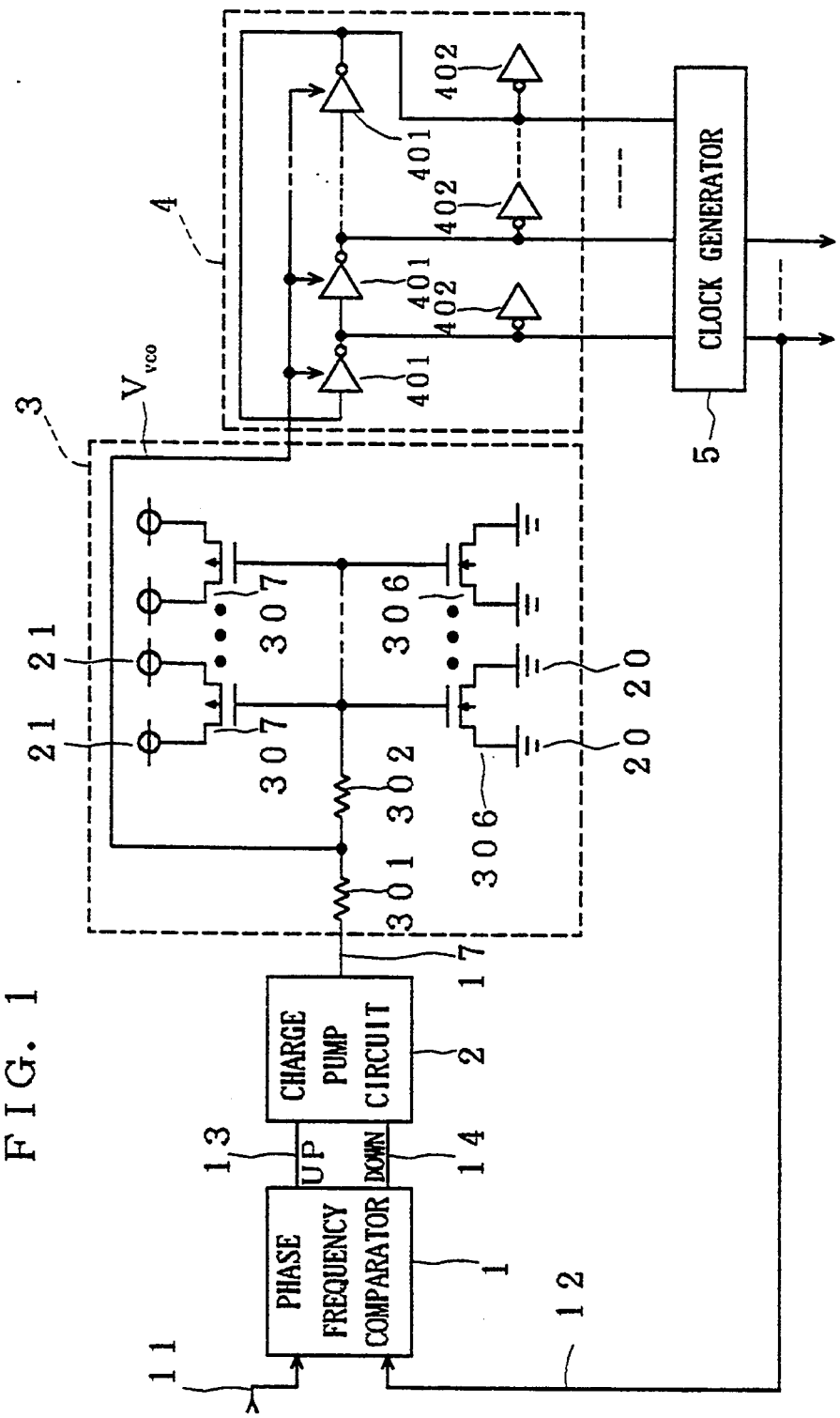
FIG. 1 is a circuit diagram showing a preferred embodiment of the present invention.

FIG. 1 is a circuit diagram of a PLL circuit according to a preferred embodiment of the present invention. The reference clock signal 11 which has a reference phase for phase synchronization is supplied to the phase frequency comparator 1. The phase frequency comparator 1 also receives the inner clock signal 12 which is to be distributed within the LSI and to be synchronized to the reference clock signal 11. The phase frequency comparator 1 compares the phases (i.e., timings) of the reference clock signal 11 and the inner clock 12 at their rises, and outputs phase information to signal lines 13 and 14 as a pulse width and a logical value in accordance with a phase difference between the reference clock signal 11 and the inner clock signal 12.

The charge pump circuit 2 outputs a positive or a negative charge 17 based on the pulse width and the logical value which are present on the signal lines 13 and 14. The loop filter 3 accumulates and consequently smooths the electric charge 17 which is received from the charge pump circuit 2.

The VCO 4 is formed by delay cells 401 for changing a delay time and loads 402 which are driven by the delay cells 401. As described earlier under "A. Technique Constituting the Basis of the Invention," the VCO 4 changes its oscillation frequency f in accordance with the output voltage $V_{VCO}$ of the loop filter 3. By changing the number of the delay cells 401 or changing capacitance values of the loads 402, the VCO 4 is constructed which is adaptive to the frequency of the reference clock signal 11 that is desired by the user.

The clock signal generator 5, formed by logic circuits such as an inverter, a NAND circuit, and a NOR circuit, processes the clock signal which is oscillated by the VCO 4 at a preselected duty ratio and thereby generates a multi-phase clock signal. By changing the interconnection of the logical circuits, the clock signal generator 5 generates inner clock signal 12 having a phase approaching a phase of the particular reference clock signal 11 chosen by a user.

If the inner signal clock 12 has a phase lag with respect to the reference clock signal 11, the phase frequency comparator 1 outputs a pulse which has a width which corresponds to the phase difference to the signal line 13 and a "low" logical value to the signal line 14. In response, the charge pump circuit 2 provides the loop filter 3 with a positive charge which has a quantity corresponding to the phase difference. The loop filter 3 integrates and consequently smooths the electric charge given thereto, whereby the potential $V_{VCO}$ gradually increases. As a result, the frequency of the VCO 4 increases and due to the increased frequency the phase of the inner clock signal 12, which is distributed through the clock signal generator 5, leads the phase of the reference clock signal 11.

Conversely, if the inner clock signal 12 has a phase lead compared to the reference clock signal 11, the phase frequency comparator 1 outputs a pulse which has a width which corresponds to the phase difference to the signal line 14 and a "low" logical value to the signal line 13. Responding to this, the charge pump circuit 2 supplies a negative charge to the loop filter 3 of a quantity which corresponds to the phase difference. Likewise to the aforementioned opposite case, the loop filter 3 integrates and consequently smooths the electric charge which is supplied thereto, gradually decreasing the potential $V_{VCO}$. As a result, the frequency of the VCO 4 decreases, which in turn causes the phase of the inner clock signal 12 to lag behind the phase of the reference clock 11.

When the phases of the reference clock signal 11 and the inner clock 12 coincide with each other in this manner, almost no positive nor negative electric charge becomes available from the charge pump circuit 2. Hence, the loop filter 3 maintains the potential $V_{VCO}$ at a certain constant value, and therefore, the frequency of the VCO 4 becomes constant. Thus, a continued phase synchronization state is ensured.

As shown in FIG. 1, the loop filter 3 is comprised of the resistor 301 (resistance $R_1$) which receives the electric charge 17, the resistor 302 (resistance $R_2$) which is connected to the charge pump circuit 2 through the resistor 301, and the NMOS transistors 306 and the PMOS transistors 307 having gate electrodes which are connected in common to the resistor 301 through the resistor 302. The potential $V_{VCO}$ is a potential which appears at a contact where the resistors 301 and 302 are connected to each other.

The sources and the drains of the NMOS transistors 306 are connected to the ground potential $V_{SS}$ 20, a feature being similar to that described in "A. Technique Constituting the Basis of the Invention." To be complimentary, the sources and the drains of the PMOS transistors 307 are connected to a power source voltage $V_{DD}$ 21. That is, the MOS transistors 306 and 307 respectively form two different MOS capacitors which have complimentary conductivities.

Thus, in this preferred embodiment, the gate electrodes of the complimentary MOS transistors 306 and 307 are connected in common. Hence, the problems described under "A. Technique Constituting the Basis of the Invention" are solved.

Figure 2:
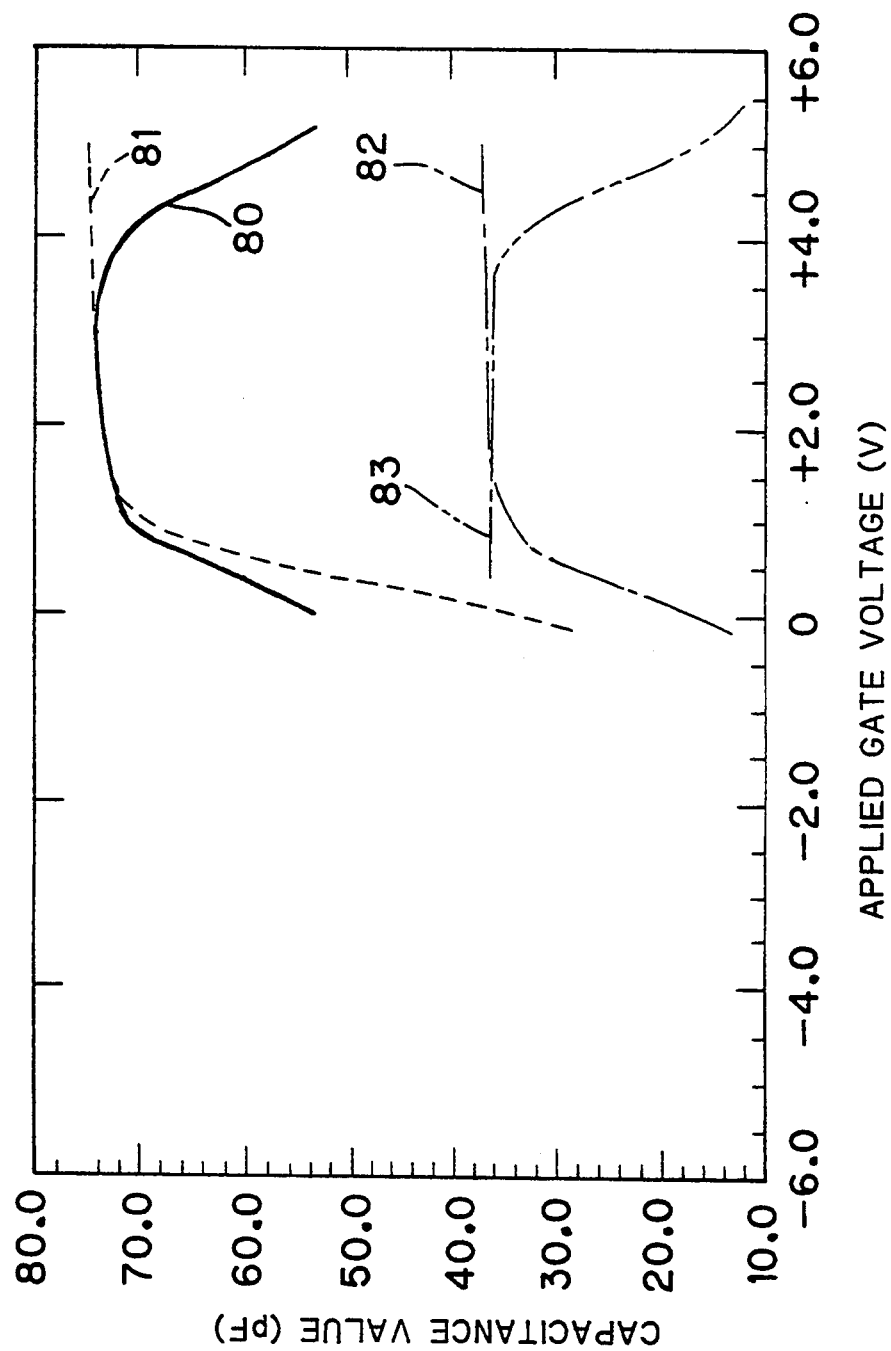
FIGS. 2 and 3 are graphs for explaining the preferred embodiment of the present invention.

FIG. 2 is a graph showing dependence of the capacitances of two different, parallel-connected, complimentary MOS capacitors on an applied gate voltage. To obtain a capacitance (about 74 pF) represented by the curve 81 at the applied gate voltage of around 1 V or higher, the NMOS transistors 306 and the PMOS transistors 307 each have a capacitance value of about 37 pF at the applied gate voltage of around 1 V or higher. The curves 82 and 83 respectively show dependence of the capacitance values of the NMOS and the PMOS transistors 306 and 307 on the applied gate voltage. The curve 80 shows a composite capacitance of the NMOS and the PMOS transistors 306 and 307.

As the curve 80 indicates, although the capacitance values decrease with a decrease in the applied gate voltage, the drops in the capacitance values are not large.

Figure 3:
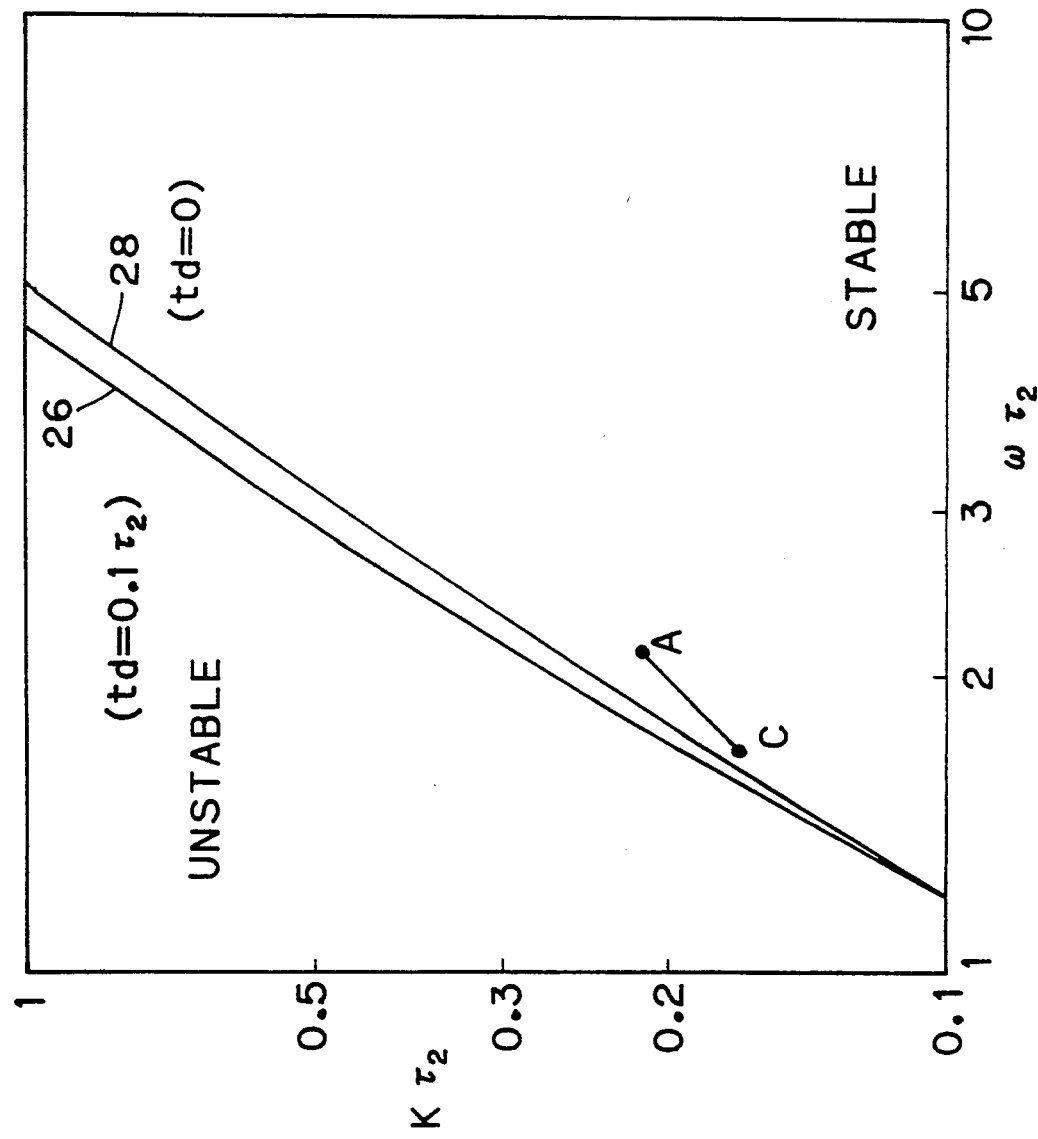

FIG. 3 is a graph showing the stability in phase synchronization of the PLL circuit. The conditions remain the same as those for FIG. 7 except the capacitance value.

At the applied gate voltage of about 2 V, the composite capacitance has the same value as that in the conventional circuit structure and the coordinates ($\omega_{T2}2$, $K_{T2}2$) are at the point A. Since the composite capacitance does not exhibit a major decrease even with a decrease in the applied gate voltage down to about 0.1 V (about 85 pF), the coordinates ($\omega_{T2}2$, $K_{T2}2$) coincide with the point C.

Hence, a decrease in the applied gate voltage would not result in the coordinates ($\omega_{T2}2$, $K_{T2}2$) moving into the left side of the stability limit curves 26 and 28, thereby ensuring stable phase synchronization in the PLL circuit.

Figure 4:
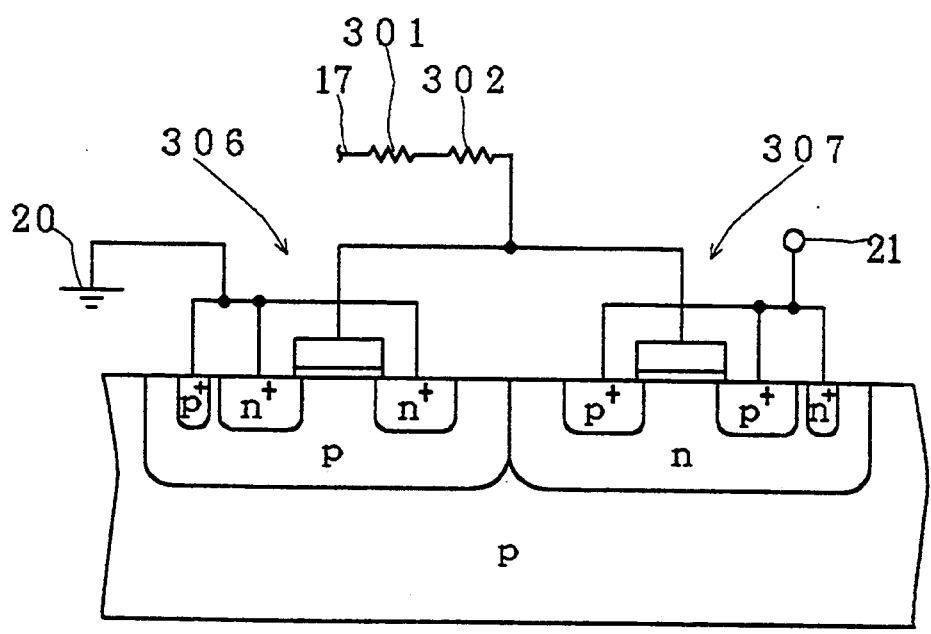
FIG. 4 is a cross sectional view of a MOS transistor which is used to attain the preferred embodiment of the present invention.

FIG. 4 is a cross sectional view of the NMOS transistors 306 and the PMOS transistors 307.

A plurality of the NMOS transistors 306 and the PMOS transistors 307 may be provided as shown in FIG. 1, or alternatively, only one NMOS transistor 306 and only one PMOS 307 transistor may be provided. Since the NMOS and the PMOS transistors 306 and 307 are easily formed on a gate array, a desired number of them are obtainable by changing the metallization process, and therefore, the capacitance values of capacitors formed by the NMOS and the PMOS transistors 306 and 307 are controlled to accommodate to the frequency of the reference clock signal 11.

While the invention has been described in detail, the foregoing description is in all aspects illustrative and not restrictive. It is understood that numerous other modifications and variations can be devised without departing from the scope of the invention.

I claim:

1. A phase synchronization circuit for synchronizing the phase of a clock signal to that of a reference clock signal, said phase synchronization circuit comprising:

clock signal generating means having an input terminal and at least one output terminal, said clock signal generating means generating a clock signal in accordance with a potential received at said input terminal and supplying said clock signal to said at least one output terminal;

electric charge generating means, having a first input terminal connected to receive said clock signal and a second input terminal for receiving a reference clock signal, for generating an electric charge corresponding to a difference in phase between said clock signal and said reference clock signal; and potential generating means, having an input terminal connected to receive said electric charge output from said electric charge generating means and an output terminal for outputting a potential corresponding to said electric charge to said clock signal generating means, said clock signal generating means, said electric charge generating means, and said potential generating means thereby forming a phase-locked loop, wherein said potential generating means comprises a first potential terminal for supplying a first potential;

a second potential terminal for supplying a second potential which is lower than said first potential;

at least one first insulated gate capacitor, each one of said at least one first insulated gate capacitor having an n type semiconductor layer connected to said first potential terminal, an insulating layer formed on said n type semiconductor layer, and a gate electrode formed adjacent to and facing said insulating layer;

at least one second insulated gate capacitor, each one of said at least one second insulated gate capacitor having a p type semiconductor layer connected to said second potential terminal, an insulating layer formed on said p type semiconductor layer, and a gate electrode formed adjacent to and facing said insulating layer; and a resistor having one terminal thereof connected to said input terminal of said potential generating means and having the other terminal thereof connected to said output terminal of said potential generating means.

2. The phase synchronization circuit according to claim 1, wherein said clock signal generating means further comprises first processing means for generating a basic signal which has a frequency corresponding to a potential which is received at said input terminal of said clock signal generating means, and second processing means for generating said clock signal on the basis of said basic signal.

3. The phase synchronization circuit according to claim 1, wherein said electric charge generating means includes:

a phase frequency comparator for outputting first phase information and second phase information, said first phase information indicating whether a phase of said clock signal which is supplied to said output terminal of said clock signal generating means lags or leads a phase of said reference clock signal, said second phase information having a pulse width which corresponds to a phase difference between a phase of said clock signal which is supplied to said output terminal of said clock signal generating means and a phase of said reference clock signal; and a charge pump circuit, having input terminals connected to receive said first phase information and said second phase information, for generating said electric charge.

4. The phase synchronization circuit according to claim 1, wherein said at least one first insulated gate capacitor comprises a plurality of said first insulated gate capacitors.

5. The phase synchronization circuit according to claim 1, wherein said at least one second insulated gate capacitor comprises a plurality of said second insulated gate capacitors.

6. The phase synchronization circuit according to claim 1, wherein each one of said at least one first insulated gate capacitor includes a p type insulated gate field effect transistor having two current electrodes, both of which are connected to said first potential terminal.

7. The phase synchronization circuit according to claim 1, wherein each one of said at least one second insulated gate capacitor includes an n type insulated gate field effect transistor having two current electrodes, both of which are connected to said second potential terminal.

* * * * *